United States Patent
Zhu et al.

(10) Patent No.: US 10,825,717 B1
(45) Date of Patent: Nov. 3, 2020

(54) METHOD FOR MAKING HIGH VOLTAGE TRANSISTORS INSENSITIVE TO NEEDLE DEFECTS IN SHALLOW TRENCH ISOLATION

(71) Applicant: NXP B.V., Eindhoven (NL)

(72) Inventors: Ronghua Zhu, San Jose, CA (US);
Eric Ooms, San Jose, CA (US); Xin Lin, San Jose, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/505,994

(22) Filed: Jul. 9, 2019

(51) Int. Cl.
| | |
|---|---|
| H01L 21/762 | (2006.01) |
| H01L 21/311 | (2006.01) |
| H01L 29/40 | (2006.01) |
| H01L 29/78 | (2006.01) |

(52) U.S. Cl.
CPC .. *H01L 21/76224* (2013.01); *H01L 21/31144* (2013.01); *H01L 29/401* (2013.01); *H01L 29/402* (2013.01); *H01L 29/7816* (2013.01)

(58) Field of Classification Search
None
See application file for complete search history.

(56) References Cited

U.S. PATENT DOCUMENTS

| | | | |
|---|---|---|---|
| 6,080,677 A | 6/2000 | Gabriel et al. | |
| 6,194,284 B1 | 2/2001 | Chen | |
| 6,277,752 B1 | 8/2001 | Chen | |
| 6,281,093 B1 | 8/2001 | Pradeep et al. | |
| 6,825,544 B1 * | 11/2004 | Jin | H01L 21/76235 |
| | | | 257/499 |
| 7,635,614 B1 | 12/2009 | Kuznetsov et al. | |
| 8,247,869 B2 | 8/2012 | Yang et al. | |
| 9,105,687 B1 * | 8/2015 | Dubois | H01L 21/76232 |
| 2002/0182852 A1 | 12/2002 | Singh | |

* cited by examiner

*Primary Examiner* — J. E. Schoenholtz (57) ABSTRACT

A method for reducing transistor sensitivity to shallow trench isolation defects (STI) includes filling a trench formed in a substrate of a semiconductor device, at least partially, with a first oxide, the trench defines an STI and includes a defect extending from the substrate. A mask defines a planar area within the isolation region including a first lateral distance between an edge of the mask and an edge of the isolation region. The first oxide is at least partially removed beneath the planar area with an oxide etch to expose a top portion of the defect. The top portion of the defect is removed with a semiconductor etch. After removing the top portion of the defect, the trench is at least partially filled with a second oxide. A field plate of a split-gate transistor is formed over the STI.

20 Claims, 9 Drawing Sheets

METHOD FOR MAKING HIGH VOLTAGE TRANSISTORS INSENSITIVE TO NEEDLE DEFECTS IN SHALLOW TRENCH ISOLATION

FIELD

This disclosure relates generally to a manufacturing process for a high voltage semiconductor device, and more specifically to reducing a sensitivity of a high voltage transistor to a defect in an isolation region of the semiconductor device.

BACKGROUND

Shallow Trench Isolation (STI) regions are typically used to form high voltage semiconductor devices. The formation of an STI includes forming a trench in a silicon substrate and thermally oxidizing the trench to form a silicon oxide layer. Due to inherent particulate on the substrate during fabrication of the STI, certain areas of the trench may not be fully etched, thus resulting in defects. In one example, the incomplete etch results in a needle defect extending vertically from the bottom of the trench.

Subsequently, the trench is filled with an oxide and a gate electrode is deposited over the region including the defect. The defect is biased to the same potential as the silicon substrate, from which it extends. Accordingly, electrical breakdown between the defect and the gate electrode may occur due to the reduced separation between the defect and the gate electrode. Mitigating the effects of the defect has traditionally being problematic due to the tight physical tolerances between the defect, the gate electrode and various active areas of the semiconductor device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for methods for reducing the sensitivity of a high voltage transistor to STI defects in a semiconductor process. During the formation of the STI, defects may occur as a result of blocked etching of the STI. In example embodiments, the defect is a needle defect, a cone defect or a pillar defect, although other defect types extending from the underlying silicon layer of an STI are envisioned within the scope of this disclosure.

Theses defects reduce a thickness of an oxide layer between one of the defects and a subsequently formed, overlying polysilicon gate. Consequently, a leakage path, (or in some embodiments, a dielectric breakdown), occurs between the defect and the gate, which reduces the performance, reliability or yield of the semiconductor device including the transistor. The sensitivity of the transistor to such defects is improved by reducing a height of the defects, thereby increasing the oxide layer thickness between the defect and the overlying gate.

Reducing the defect height is achieved by using a mask to define an area within the STI for exposing and partially etching back the defect. This mask requires tightly controlled spacing with respect to the overlying polysilicon gate and also with respect to an edge of the STI. The mask must have sufficient separation from the STI edge to prevent etching damage to the STI sidewall. Conversely, the separation of the mask from the STI edge must be sufficiently small to reduce a number of defects that will not be subject to the defect height reduction methods described herein. The mask separation from the nearest edge of the polysilicon gate must also be sufficiently small to minimize a breakdown voltage of the transistor.

Embodiments described herein, include a split gate transistor configuration, which includes a first polysilicon gate electrode over a channel region on the substrate, and a second polysilicon gate electrode over an isolation region (e.g., an STI) to form a field plate to bias an underlying drift region. The aforementioned critical mask spacing and alignment are alleviated with a split gate transistor configuration, and the defect height reduction methods described in this disclosure, effectively reduce the transistor sensitivity to defects in the isolation region, or STI.

Figure 1:
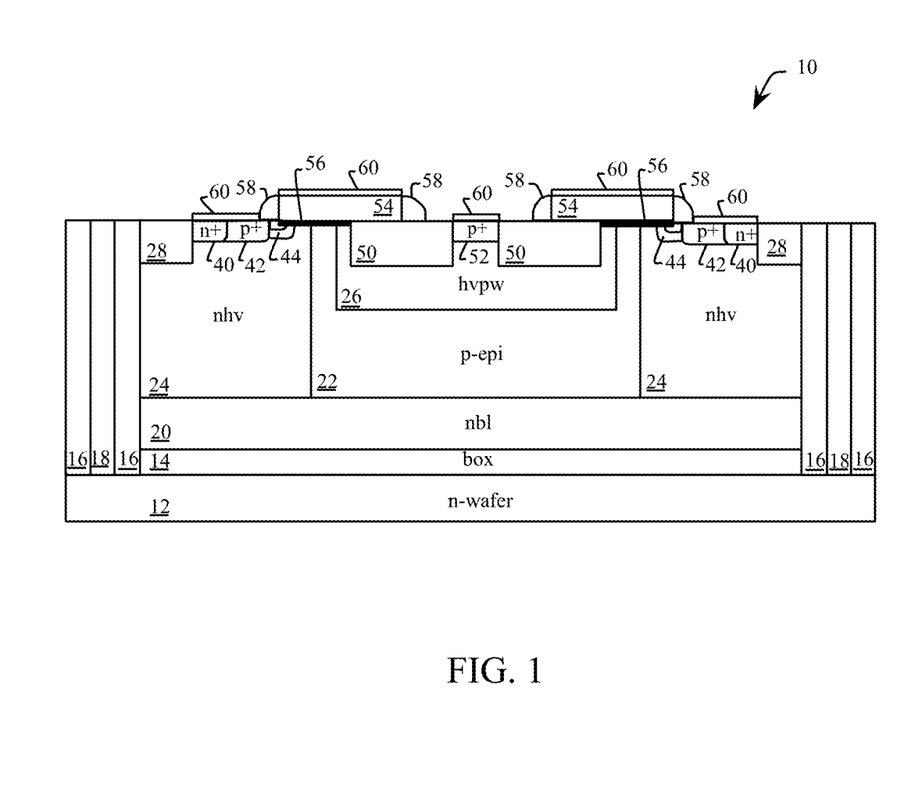
FIG. 1 is a cross-sectional view of an example embodiment of a p-type Laterally Diffused Metal Oxide Semiconductor (LDMOS).

FIG. 1 shows an example embodiment 10 of a p-type LDMOS. The LDMOS is formed on an n-type wafer (e.g., an n-wafer) 12. A bulk oxide (e.g., box) 14 is formed on the n-wafer 12. An oxide 16 encloses a vertical n-type shield 15. An n-type buried layer (e.g., nbl) 20 is formed on the box 14. The box 14 and the n-typed shield 15 form a shielded region, within which transistors are formed. A p-type epitaxial layer (e.g., p-epi) 22 is formed on the nbl 20. N-type high voltage implants (e.g., nhv) 24 are formed over the nbl 20 to form a respective body region for each of two transistors included in the embodiment 10. A p-type high voltage p-well (e.g., hvpw) 26 is formed in the p-epi 22. An STI 28 is formed between a body contact 40 of each respective transistor and the n-type shield 18. The body contact 40 forms a low impedance connection to the nhv 24. A source contact 42 abuts the body contact 40. A pair of p-type extension implants (e.g., pext) 44 are formed adjacent to the source contact 42.

An STI 50 is formed in the hvpw 26 drift region for each respective transistor. A shared drain contact 52 is formed in the hvpw 26. A polysilicon gate 54 is formed over the STI 50 and a channel region 56 for each respective transistor. A spacer 58 is formed laterally on either side of the polysilicon gate 54 for each respective transistor. A silicide 60 is formed over the butted body contact 40 and source contact 42 for each respective transistor. The silicide 60 is also formed over each polysilicon gate 54 and the shared drain contact 60.

Figure 2:
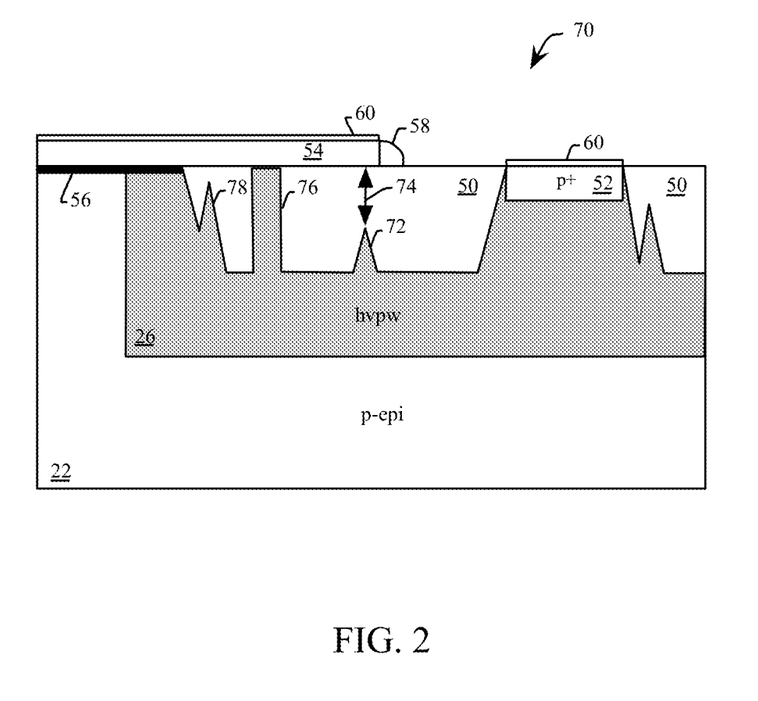
FIG. 2 is a cross-sectional view of a formation of a trench with defects during a fabrication stage of the LDMOS of FIG. 1.

FIG. 2 shows a portion 70 of the embodiment 10 of FIG. 1, including defects in the STI 50. A needle defect 72 extends from the hvpw 26, thus creating a reduction in the vertical separation 74 of the hvpw 26 and the gate electrode 54. The hvpw 26 and the gate electrode are biased to different potentials, hence the reduced vertical separation 74 causes undesirable leakage therebetween. In one embodiment, the reduction in the vertical separation 74 results in an oxide breakdown between the needle defect 72 and the gate electrode 54. FIG. 2 further shows a pillar defect 76 extending to the surface of the STI 50, and a needle defect 78 on a sidewall of the STI 50.

Figure 3:
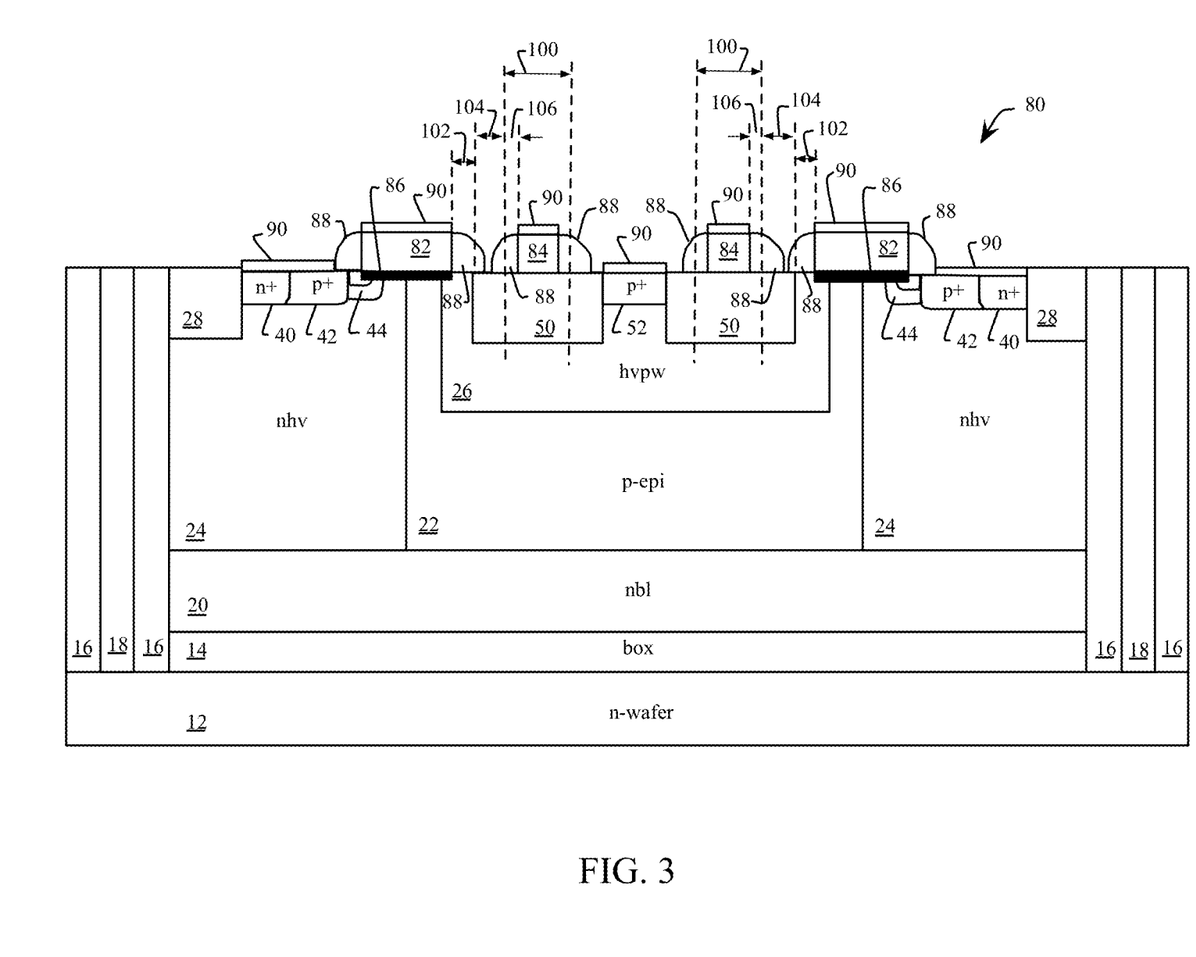
FIG. 3 is a cross-sectional view of a split-gate transistor with a mask for reducing a transistor sensitivity to a defect in an STI, in accordance with an example embodiment of the present disclosure.

FIG. 3 shows an example embodiment 80 of a p-type LDMOS with a split gate configuration and a mask for reducing transistor sensitivity to STI defects in accordance with the present disclosure. In contrast to the embodiment 10 of FIG. 1, the embodiment 80 includes a first polysilicon gate electrode 82 separate from a second polysilicon gate electrode 84. The first polysilicon gate electrode 82 is formed over a channel region 86 and controls the formation and conduction of the channel region 86. The second polysilicon gate electrode 84 is formed over an isolation region (e.g., an STI 50), and forms a field plate with the drift region in the hvpw 26. A spacer 88 is formed laterally on either side of the first polysilicon gate 82 and the second polysilicon gate 84 for each respective transistor. A silicide 90 is formed over the butted body contact 40 and source contact 42 for each respective transistor. The silicide 90 is also formed over each polysilicon gate 82, 84 and the shared drain contact 52.

In the embodiment 80, a respective mask 100 defines an area within each of the STI 50 regions for further processing. In the embodiment 80, the first polysilicon gate electrode 82 is separated from the STI edge by a distance 102. The mask 100 is separated from the STI edge by a first distance 104, and from the second polysilicon electrode 84 by a second distance 106. It should be appreciated that a similarly constrained separation of the mask 100 as shown by the first distance 104 and the second distance 106 applies to both respective STI edges and both respective edges of the second polysilicon electrode 84.

Figure 4:
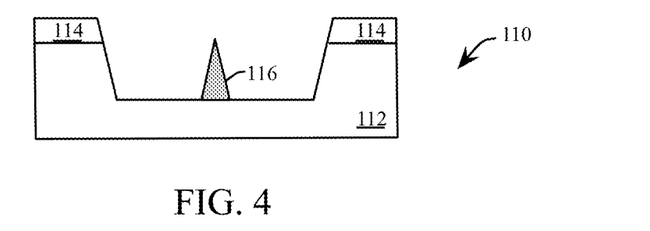
FIG. 4 is a cross-sectional view of a fabrication stage of a semiconductor device including the reduction of the transistor sensitivity to the STI defect, in accordance with an example embodiment of the present disclosure.
Figure 5:
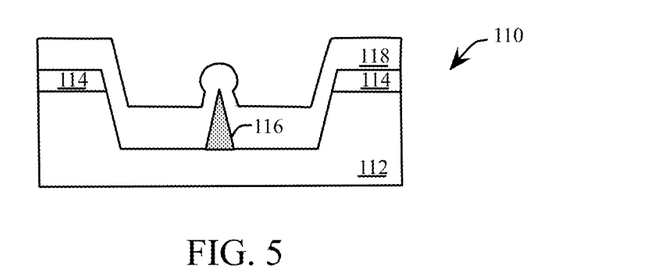
FIG. 5 is a cross-sectional view of a fabrication stage of a semiconductor device including the reduction of the transistor sensitivity to the STI defect, in accordance with an example embodiment of the present disclosure.
Figure 6:
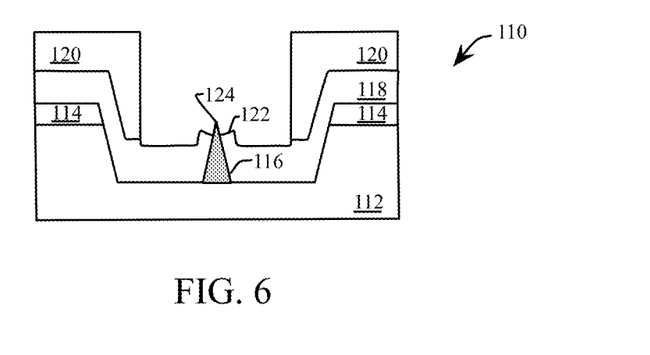
FIG. 6 is a cross-sectional view of a fabrication stage of a semiconductor device including the reduction of the transistor sensitivity to the STI defect, in accordance with an example embodiment of the present disclosure.

FIG. 4 through FIG. 9 show a sequence of fabrication stages of a semiconductor device 110 using a novel method to reduce a transistor sensitivity to an STI defect. FIG. 4 shows an early stage of STI formation, similar to that used to form the STI 50 of FIG. 3. A Silicon substrate 112, is patterned with a Silicon Nitride layer (114). The opening defined by the Silicon Nitride layer 114 is used to etch a trench in the substrate 112. Due to particles or other impurities on the substrate 112, a region in the trench is blocked from being fully etched. Accordingly, the blocked etch forms a needle defect 116. As shown in FIG. 5, a High Density Plasma (HDP) oxide 118 is deposited to partially fill the trench. As shown in FIG. 6, a photo resist mask 120 is deposited and patterned to open a planar area, within the planar area defined by the STI trench sidewalls. In another embodiment, the photo resist mask is replaced with another type of mask, not limited by photolithography. Using the photo resist mask 120 to define the planar area, the HDP oxide 118 is etched to remove the oxide coating 122 of the pillar 116, thereby exposing a top portion 124 of the needle defect 116.

Figure 7:
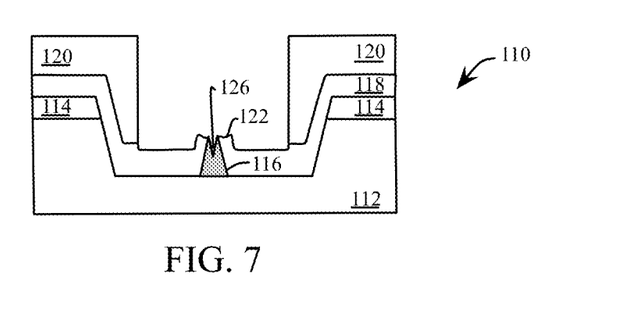
FIG. 7 is a cross-sectional view of a fabrication stage of a semiconductor device including the reduction of the transistor sensitivity to the STI defect, in accordance with an example embodiment of the present disclosure.
Figure 8:
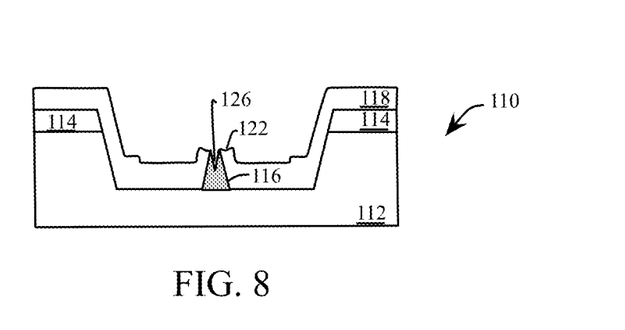
FIG. 8 is a cross-sectional view of a fabrication stage of a semiconductor device including the reduction of the transistor sensitivity to the STI defect, in accordance with an example embodiment of the present disclosure.
Figure 9:
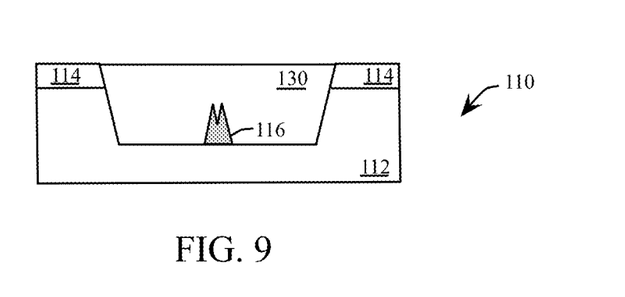
FIG. 9 is a cross-sectional view of a fabrication stage of a semiconductor device including the reduction of the transistor sensitivity to the STI defect, in accordance with an example embodiment of the present disclosure.
Figure 10:
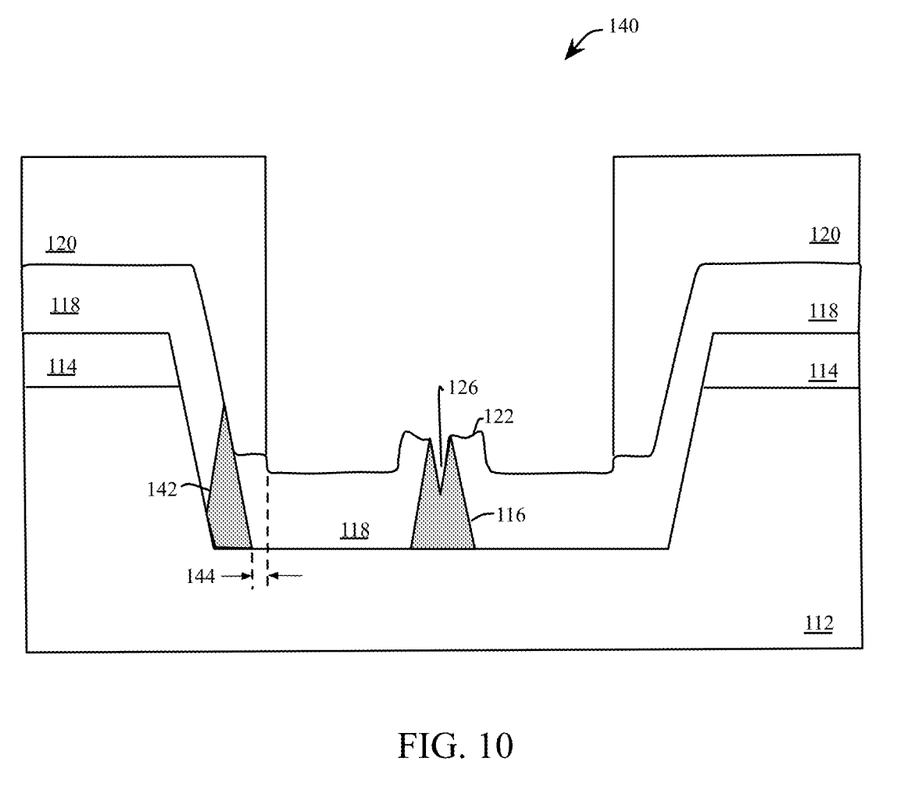
FIG. 10 is a cross-sectional view of a fabrication stage of a semiconductor device as shown in FIG. 8 with a defect unable to be reduced due to mask blockage.

As shown in FIG. 7, a polysilicon etch step reduces the top portion 124 of the needle defect 116 to a reduced height 126. The embodiment 110 of FIG. 7 uses a polysilicon etch step to reduce a height of a silicon-based needle defect 116. It should be appreciated that other embodiments comprising a defect based on a material other than silicon will use the appropriate type of semiconductor etch method to achieve a similar reduction in the height of the needle defect 116. As shown in FIG. 8, the photo resist mask 120 is removed. As shown in FIG. 9, the trench is at least partially filled with an oxide 130, to complete the STI formation, similar to the STI 50 of FIG. 3. FIG. 10, with reference to FIG. 7, shows a fabrication stage of a semiconductor device having two needle defects in the etched trench. In contrast to the needle defect 116, the needle defect 142 is on a sidewall of the STI and unable to be etched back with the etch step shown in FIG. 7. Specifically, when the first distance 104 shown in FIG. 3, between the mask and the STI edge is too large, the photo resist mask 120 will overlap the needle defect 142 by a distance 144, thereby blocking the etch back of the needle defect 142.

Figure 11:
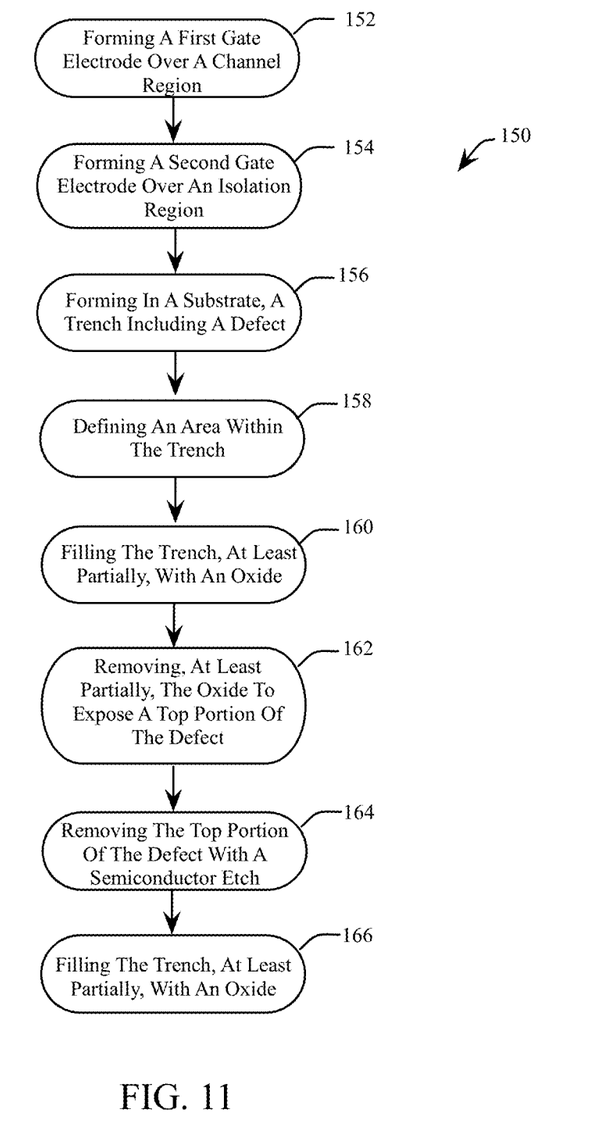
FIG. 11 is a flowchart representation of a method for manufacturing a semiconductor device in accordance with an example embodiment of the present disclosure.

FIG. 11, with reference to FIG. 3, shows a method 150 for manufacturing a semiconductor device in accordance with an example embodiment of the present disclosure. At 152, a first gate electrode 82 is formed over a channel region 86. At 154, a second gate electrode 84 is formed over an isolation region (e.g., an STI 50). At 156, a trench is formed in a substrate 26, including a defect (e.g., a needle, cone or pillar defect). At 158, an area within the trench is defined (e.g., with a mask 100). At 160, the trench is, at least partially, filled with an oxide. At 162, the oxide is, at least partially, removed to expose a top portion of the defect. At 164, the top portion of the defect is removed with a semiconductor etch (e.g., a silicon etch when the defect comprises silicon). At 166, the trench is, at least partially, filled with an oxide.

Figure 12:
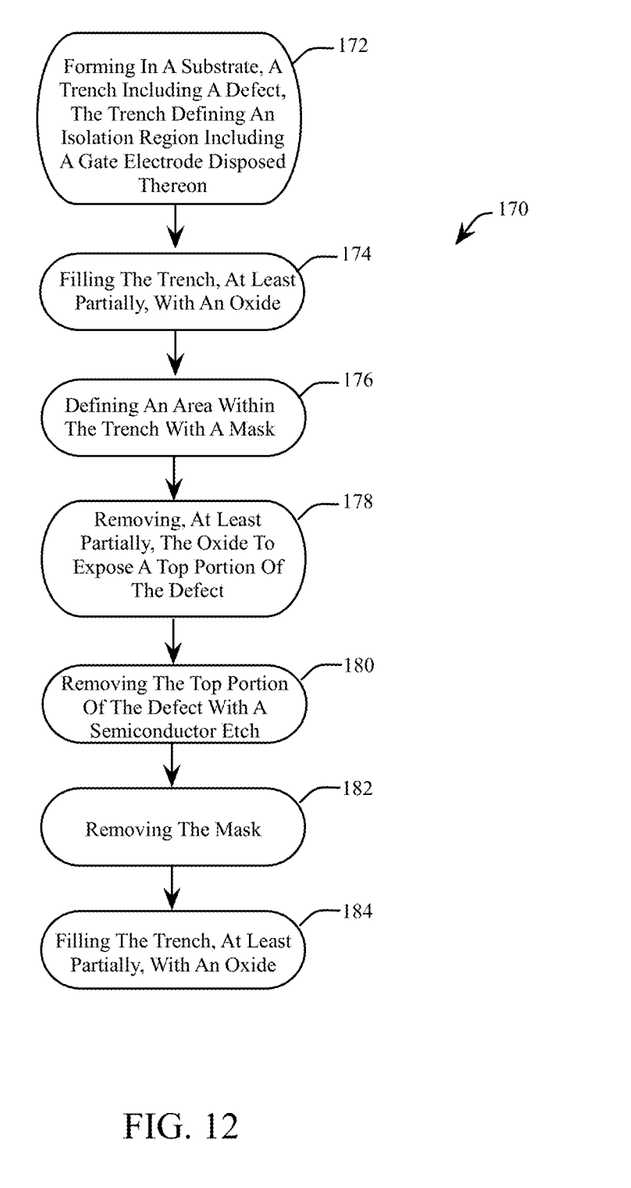
FIG. 12 is a flowchart representation of a method for manufacturing an isolation region in accordance with an example embodiment of the present disclosure.

FIG. 12, with reference to FIG. 3, shows a method 170 for manufacturing a semiconductor device in accordance with an example embodiment of the present disclosure. At 172, a trench including a defect is formed in a substrate 26, wherein the trench defines an isolation region (e.g., an STI 50), including a gate electrode 84 disposed thereon. At 174, the trench is, at least partially, filled with an oxide. At 176, an area is defined with the trench with a mask 100. At 178, the oxide is, at least partially, removed to expose a top portion of the defect. At 180, the top portion of the defect is removed with a semiconductor etch. At 182, the mask is removed. At 184, the trench is, at least partially, filled with an oxide.

Figure 13:
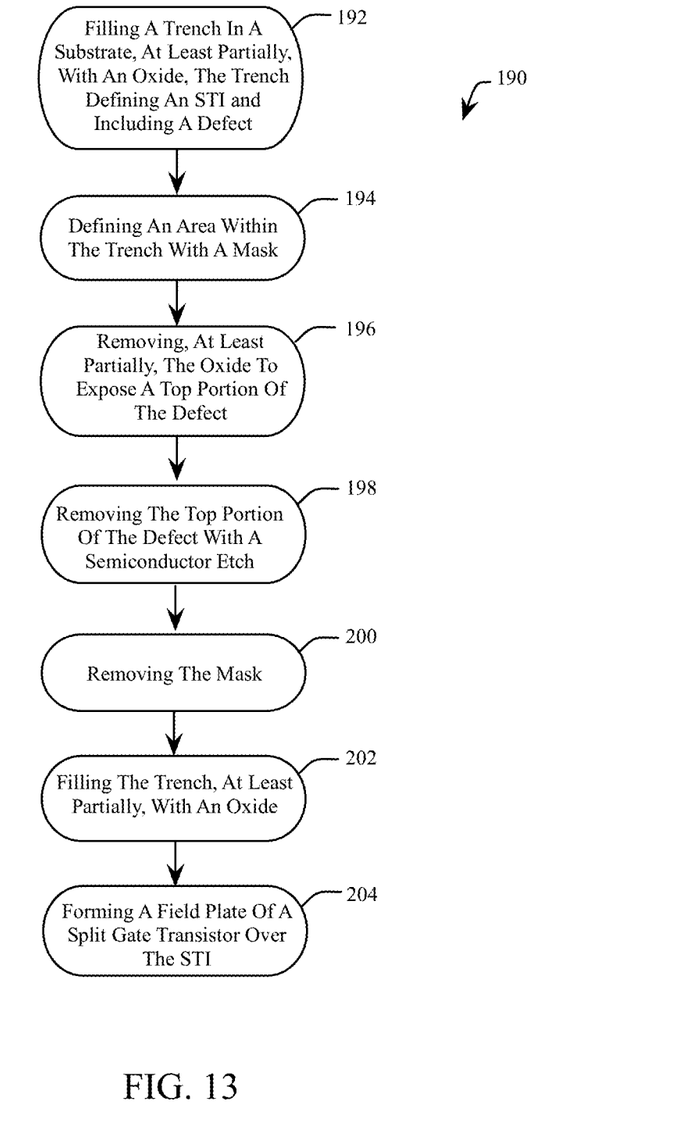
FIG. 13 is a flowchart representation of a method for reducing transistor sensitivity to STI defects in accordance with an example embodiment of the present disclosure.

FIG. 13, with reference to FIG. 3, shows a method 190 for manufacturing a semiconductor device in accordance with an example embodiment of the present disclosure. At 192, a trench in a substrate is filled, at least partially, with an oxide, wherein the trench defines an STI (e.g. an STI 50), including a defect. At 194, an area within the trench is defined with a mask 100. At 196, the oxide is, at least partially, removed to expose the top portion of the defect. At 198, the top portion of the defect is removed with a semiconductor etch. At 200, the mask 100 is removed. At 202, the trench is, at least partially, filled with an oxide. At 204, a field plate of a split gate transistor is formed over the STI.

As will be appreciated, embodiments as disclosed include at least the following. In one embodiment, a method for manufacturing a semiconductor device comprises forming a first gate electrode over a channel region. A second gate electrode is formed over an isolation region, wherein the first gate electrode is laterally separated from the isolation region, and the isolation region is formed by performing the steps of forming a trench in a substrate of the semiconductor device, the trench defining a first planar area of the isolation region and comprising a defect; defining with a mask, a second planar area within the first planar area comprising a first lateral distance between an edge of the mask and an edge of the isolation region, and a second lateral distance between the edge of the mask and an edge of the second gate electrode; filling the trench, at least partially, with a first oxide; removing, at least partially, the first oxide with an oxide etch to expose a top portion of the defect; removing the top portion of the defect with a semiconductor etch, thereby increasing a vertical separation between the second gate electrode and the defect; and after removing the top portion of the defect, filling the trench, at least partially, with a second oxide.

Alternative embodiments of the method for manufacturing a semiconductor device include one of the following features, or any combination thereof. The first lateral distance exceeds a threshold value to prevent the semiconductor etch from etching a sidewall of the trench. The first lateral distance is less than a threshold value to reduce a number of defects blocked from being etched by the semiconductor etch. The second lateral distance is less than a threshold value to reduce a breakdown voltage of the semiconductor device. The trench is completely filled with the second oxide prior to forming the second gate electrode. The isolation region is a shallow trench isolation region. The semiconductor device is a p-type high voltage transistor. The semiconductor device is an n-type high voltage transistor. The first oxide is a high density plasma oxide. The mask defines a respective isolation region of two semiconductor devices sharing a common drain contact disposed therebetween. The defect is one of a needle defect, a cone defect and a pillar defect.

In another embodiment, a method for manufacturing an isolation region comprises forming a trench in a substrate of a semiconductor device, the trench defining a first planar area of an isolation region, the trench comprising a defect and the isolation region comprising a gate electrode disposed thereon. The trench is filled, at least partially, with a first oxide. A mask defines a second planar area within the first planar area comprising a first lateral distance between an edge of the mask and an edge of the isolation region, and a second lateral distance between the edge of the mask and an edge of the gate electrode. The first oxide beneath the second planar area is at least partially removed, with an oxide etch to expose a top portion of the defect. The top portion of the defect is removed with a semiconductor etch, thereby increasing a vertical separation between the second gate electrode and the defect. After removing the top portion of the defect, the trench is at least partially filled with a second oxide.

Alternative embodiments of the method for manufacturing an isolation region include one of the following features, or any combination thereof. The first lateral distance exceeds a threshold value to prevent the semiconductor etch from etching a sidewall of the trench. The first lateral distance is less than a threshold value to reduce a number of defects blocked from being etched by the semiconductor etch. The second lateral distance is less than a threshold value to reduce a breakdown voltage of the semiconductor device. The first oxide is a high density plasma oxide. The defect is one of a needle defect, a cone defect and a pillar defect.

In another embodiment, a method for reducing transistor sensitivity to STI defects comprises filling a trench formed in a substrate of a semiconductor device, at least partially, with a first oxide, the trench defining an STI and comprising a defect extending from the substrate. A mask defines a planar area within the isolation region comprising a first lateral distance between an edge of the photo resist mask and an edge of the isolation region. The first oxide beneath the planar area is at least partially removed with an oxide etch to expose a top portion of the defect. The top portion of the defect is removed with a semiconductor etch. After removing the top portion of the defect, the trench is at least partially filled with a second oxide. A field plate of a split-gate transistor is formed over the STI.

Alternative embodiments of the method for reducing transistor sensitivity to STI defects include one of the following features, or any combination thereof. The first lateral distance exceeds a threshold value to prevent the semiconductor etch from etching a sidewall of the trench. The first lateral distance is less than a threshold value to reduce a number of defects blocked from being etched by the semiconductor etch. A first width of the photo resist mask reduced by a second width of the field plate is less than a threshold value to reduce a breakdown voltage of the split-gate transistor.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for manufacturing a semiconductor device comprising:
   forming a first gate electrode over a channel region; and
   forming a second gate electrode over an isolation region,
      wherein the first gate electrode is laterally separated from the isolation region, and the isolation region is formed by performing the steps of:

forming a trench in a substrate of the semiconductor device, the trench defining a first planar area of the isolation region and comprising a defect, defining with a mask, a second planar area within the first planar area comprising a first lateral distance between an edge of the mask and an edge of the isolation region, and a second lateral distance between the edge of the mask and an edge of the second gate electrode, filling the trench, at least partially, with a first oxide, removing, at least partially, the first oxide with an oxide etch to expose a top portion of the defect, removing the top portion of the defect with a semiconductor etch, thereby increasing a vertical separation between the second gate electrode and the defect, and after removing the top portion of the defect, filling the trench, at least partially, with a second oxide.

2. The method of claim 1 wherein the first lateral distance exceeds a threshold value to prevent the semiconductor etch from etching a sidewall of the trench.

3. The method of claim 1 wherein the first lateral distance is less than a threshold value to reduce a number of defects blocked from being etched by the semiconductor etch.

4. The method of claim 1 wherein the second lateral distance is less than a threshold value to reduce a breakdown voltage of the semiconductor device.

5. The method of claim 1 further comprising completely filling the trench with the second oxide prior to forming the second gate electrode.

6. The method of claim 1 wherein the isolation region is a shallow trench isolation region.

7. The method of claim 1 wherein the semiconductor device is a p-type high voltage transistor.

8. The method of claim 1 wherein the semiconductor device is an n-type high voltage transistor.

9. The method of claim 1 wherein the first oxide is a high density plasma oxide.

10. The method of claim 1 wherein the defect is one of a needle defect, a cone defect and a pillar defect.

11. A method for manufacturing an isolation region comprising:

forming a trench in a substrate of a semiconductor device, the trench defining a first planar area of an isolation region, the trench comprising a defect and the isolation region comprising a gate electrode disposed thereon;

filling the trench, at least partially, with a first oxide;

defining with a mask, a second planar area within the first planar area comprising a first lateral distance between an edge of the mask and an edge of the isolation region, and a second lateral distance between the edge of the mask and an edge of the gate electrode;

removing, at least partially, the first oxide beneath the second planar area, with an oxide etch to expose a top portion of the defect;

removing the top portion of the defect with a semiconductor etch, thereby increasing a vertical separation between the second gate electrode and the defect; and after removing the top portion of the defect, filling the trench, at least partially, with a second oxide.

12. The method of claim 11 wherein the first lateral distance exceeds a threshold value to prevent the semiconductor etch from etching a sidewall of the trench.

13. The method of claim 11 wherein the first lateral distance is less than a threshold value to reduce a number of defects blocked from being etched by the semiconductor etch.

14. The method of claim 11 wherein the second lateral distance is less than a threshold value to reduce a breakdown voltage of the semiconductor device.

15. The method of claim 11 wherein the first oxide is a high density plasma oxide.

16. The method of claim 11 wherein the defect is one of a needle defect, a cone defect and a pillar defect.

17. A method for reducing transistor sensitivity to shallow trench isolation (STI) defects comprising:

filling a trench formed in a substrate of a semiconductor device, at least partially, with a first oxide, the trench defining an STI and comprising a defect extending from the substrate;

defining with a photo resist mask, a planar area within the isolation region, wherein an edge of the photo resist mask defining the planar area is a first lateral distance from an edge of the isolation region;

removing, at least partially, the first oxide beneath the planar area with an oxide etch to expose a top portion of the defect;

removing the top portion of the defect with a semiconductor etch;

after removing the top portion of the defect, filling the trench, at least partially, with a second oxide; and forming a field plate of a split-gate transistor over the STI.

18. The method of claim 17 wherein the first lateral distance exceeds a threshold value to prevent the semiconductor etch from etching a sidewall of the trench.

19. The method of claim 17 wherein the first lateral distance is less than a threshold value to reduce a number of defects blocked from being etched by the semiconductor etch.

20. The method of claim 17 wherein a first width of the photo resist mask reduced by a second width of the field plate is less than a threshold value to reduce a breakdown voltage of the split-gate transistor.

* * * * *